(12) United States Patent
Wahl

(10) Patent No.: US 11,476,855 B2
(45) Date of Patent: Oct. 18, 2022

(54) ANALOG COUNTER WITH PULSED CURRENT SOURCE FOR A DIGITAL PIXEL

(71) Applicant: RAYTHEON COMPANY, Waltham, MA (US)

(72) Inventor: Richard E. Wahl, Lubbock, TX (US)

(73) Assignee: RAYTHEON COMPANY, Waltham, MA (US)

( * ) Notice: Subject to any disclaimer, the term of this patent is extended or adjusted under 35 U.S.C. 154(b) by 255 days.

(21) Appl. No.: 16/749,223

(22) Filed: Jan. 22, 2020

(65) Prior Publication Data

US 2021/0226637 A1 Jul. 22, 2021

(51) Int. Cl.
| | |
|---|---|
| *H03K 21/38* | (2006.01) |
| *G01J 1/46* | (2006.01) |
| *H03K 21/02* | (2006.01) |
| *H03K 21/08* | (2006.01) |
| *H04N 5/378* | (2011.01) |

(52) U.S. Cl.
CPC ............ *H03K 21/38* (2013.01); *G01J 1/46* (2013.01); *H03K 21/02* (2013.01); *H03K 21/08* (2013.01); *H04N 5/378* (2013.01)

(58) Field of Classification Search
CPC ........ H03K 21/38; H03K 21/02; H03K 21/08; G01J 1/46; H04N 5/378; H04N 5/37455; H03M 1/34; H03M 1/60; H03M 1/50
See application file for complete search history.

(56) References Cited

U.S. PATENT DOCUMENTS

| | | | |
|---|---|---|---|
| 6,208,282 B1 * | 3/2001 | Miyamoto | G06F 7/5013 341/172 |
| 9,380,245 B1 | 6/2016 | Guidash et al. | |
| 9,674,471 B1 | 6/2017 | Boemler | |
| 10,051,221 B2 * | 8/2018 | Sakakibara | H04N 5/378 |
| 10,187,048 B2 * | 1/2019 | Sugiyama | H03K 5/08 |
| 10,348,995 B2 * | 7/2019 | Harada | H01L 27/14612 |
| 11,195,866 B2 * | 12/2021 | Ikeda | G06N 3/0481 |

(Continued)

OTHER PUBLICATIONS

Li, et al. "A 10 Bit Analog Counter in Spad Pixel" 2017 China Semiconductor Technology International Conference (CSTIC), IEEE, Mar. 12, 2017, pp. 1-3.

(Continued)

*Primary Examiner* — Tony Ko
(74) *Attorney, Agent, or Firm* — Cantor Colburn LLP

(57) ABSTRACT

An analog counter circuit for use with a digital pixel includes an input; an output; a first inverter connected to the input that produces on a first inverter output a time delayed inverted signal (RP*) from an input signal received at the input; a second inverter connected to the first inverter output that produces a time delayed signal (RP) at a second inverter output from the input signal and that is delayed relative to RP* and a control switch connected between a source voltage and a floating node. The control switch is controlled by the signal RP* on the first inverter output. The analog counter also includes a feedback capacitor connected between the second inverter output and the floating node; an accumulating capacitor that accumulates at least some of a charge that passes through the control switch; and an injection switch connected between the control switch and the accumulating capacitor.

18 Claims, 3 Drawing Sheets

(56) References Cited

U.S. PATENT DOCUMENTS 11,233,966 B1 * 1/2022 Niclass .............. H04N 5/37455

OTHER PUBLICATIONS

Notification of Transmittal of the International Search Report of the International Searching Authority, or the Declaration; PCT/US2020/060827; dated Feb. 19, 2021, 6 pages.
Notification of Transmittal of the Written Opinion of the International Searching Authority, or the Declaration; PCT/US2020/060827; dated Feb. 19, 2021, 6 pages.
Panina, et al. "Compact CMOS Analog Counter for SPAD Pixel Arrays" IEEE Transactions on Circuits and Systems-II: Express Briefs, vol. 61, No. 4, Apr. 2014, 5 pages.
Peizerat, et al. "An analog counter architecture for pixel-level Adc", IISW P21, 2009, 3 pages.
Schultz, et al. "Digital-Pixel Focal Plane Array Technology" Lincoln Laboratory Journal, vol. 20, No. 2, 2014, pp. 36-51.

* cited by examiner

ANALOG COUNTER WITH PULSED CURRENT SOURCE FOR A DIGITAL PIXEL

BACKGROUND

The present disclosure relates to a digital pixel imager and, in particular, an analog counter for a digital pixel.

In legacy analog imagers, particularly infrared imagers, photocurrent from a detector diode is integrated by a well capacitor coupled to the detector diode, and then once per video frame, the voltage or charge of each well capacitor is transferred to a downstream analog-to-digital converter (ADC), where the voltage is converted to a binary value. Pixel sizes continue to shrink and the ratio of well capacitor to pixel area shrinks disproportionately more. Simultaneously, there is a demand by consumers for increased Signal-to-Noise Ratio (SNR) which can be realized by increasing effective well capacitance.

In-pixel ADC imagers are used to address this problem associated with decreasing pixel size. In particular, in-pixel ADC imaging improves photo-charge capacity for infrared imaging and other applications as the size of pixels continues to decrease. A good in-pixel ADC design can store nearly all of the available photo-charge from a detector diode and thus improve SNR to near theoretical limits. A common method of integration for in-pixel ADC circuits uses a quantizing analog front end circuit which accumulates charge over a relatively small capacitor, trips a threshold and is then reset. This pattern is repeated as more photo-current integrates.

An example of an in-pixel ADC circuit 100 is illustrated in FIG. 1. Charge from a photodiode 110 is accumulated over an integration capacitor 115. As charge is accumulated across the integration capacitor 115 it is compared to a threshold voltage (Vref) by a comparator 120. When the voltage across the integration capacitor 115 (referred to as Vint herein) exceeds Vref the circuit 100 is reset via a reset switch 130 that receives a control signal Reset from the comparator 120. During a reset, a voltage equal to the difference between Vref and Vreset is subtracted from the integration capacitor 115. Vreset can be referred to as a base voltage herein.

Control of the flow of current from the photodiode 110 is controlled by an injection transistor 112. The gate of the injection transistor 112 is coupled to a bias voltage Vbias. The level of this voltage can be selected by the skilled artisan and is used, in part, to keep the photodiode 110 in reverse bias where the voltage at node 114 is lower than the diode supply voltage Vdiode. If the voltage at node 114 exceeds Vbias, current created in the photodiode 110 is allowed to pass through the injection transistor 112 for accumulation by the integration capacitor 115.

Each reset event is accumulated (counted) with a counter circuit 135. In some instances the counter circuit 135 is a digital circuit.

After the integration time expires, the "count" accumulated on the counter circuit 135 can be read out. Also, any residual charge accumulated on the integration capacitor 115 can be read out by, for example, a single slope ADC or any other type of ADC. Such operations are known in the prior art.

The example in-pixel ADC circuit 100 illustrated in FIG. 1 is an asynchronous circuit. In asynchronous in-pixel ADCs, the comparator reset event occurs as soon as the voltage on the integration capacitor 115 crosses the comparator threshold.

SUMMARY

According to one embodiment, an analog counter circuit for use with a digital pixel is disclosed. The analog counter includes an input; an output; a first inverter connected to the input that produces on a first inverter output a time delayed inverted signal (RP*) from an input signal received at the input; a second inverter connected to the first inverter output that produces a time delayed signal (RP) at a second inverter output from the input signal and that is delayed relative to RP* and a control switch connected between a source voltage and a floating node, wherein the control switch is controlled by the signal RP* on the first inverter output. The analog counter also includes a feedback capacitor connected between the second inverter output and the floating node; an accumulating capacitor that accumulates at least some of a charge that passes through the control switch; and an injection switch connected between the control switch and the accumulating capacitor.

In a circuit according to any prior embodiment, the accumulating capacitor can be connected between the output and a reset voltage.

In a circuit according to any prior embodiment, the circuit further includes a frame reset switch connected in parallel with the accumulating capacitor.

In a circuit according to any prior embodiment, the injection switch has gate that is connected to a counter bias voltage Vcb.

In a circuit according to any prior embodiment, the control switch is a P-channel MOSFET that has a gate, a drain and a source.

In a circuit according to the prior embodiment, the gate of the P-channel MOSFET is connected to the first inverter output.

In a circuit according to the prior embodiment, the drain of the P-channel MOSFET is connected to source voltage and the source of the P-channel MOSFET is connected to the floating node.

In a circuit according to the prior embodiment, the injection switch is a P-channel MOSFET with an injection gate connected to bias voltage, an injection drain connected to the floating node and an injection source connected to the output and the accumulating capacitor.

Also disclosed is a digital pixel. The digital pixel includes: a photocurrent source; an injection transistor connected to the photocurrent source; an integration capacitor connected between the injection transistor and a reset voltage; and a comparator having inputs connected to the injection transistor and to a reference voltage. The comparator has an output on which it provides an output RESET signal that has either a high or low value based on a relationship between the reference voltage and a voltage on the integration capacitor. The digital pixel can include a an analog counter according to any prior embodiment that is connected to the output of the comparator.

In any prior digital pixel, the pixel can include a reset switch connected in parallel with the integrating capacitor, the reset switch being controlled by the time delayed signal (RP).

In any prior digital pixel, a gate of the reset switch is connected to the second inverter output.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

The diagrams depicted herein are illustrative. There can be many variations to the diagram or the operations described. For instance, the actions can be performed in a differing order or actions can be added, deleted or modified. Also, the terms "coupled", "connected" and variations thereof, describe having a conductive path between two elements. The use of such terms herein provides written description for both direct and indirect couplings/connections. In the claims, such terms shall include both direct and indirect connections/couplings unless the claim specifically states that connection is direct. A direct connection/coupling is a connection/coupling between the elements with no intervening elements/connections between them.

DETAILED DESCRIPTION

Figure 1:
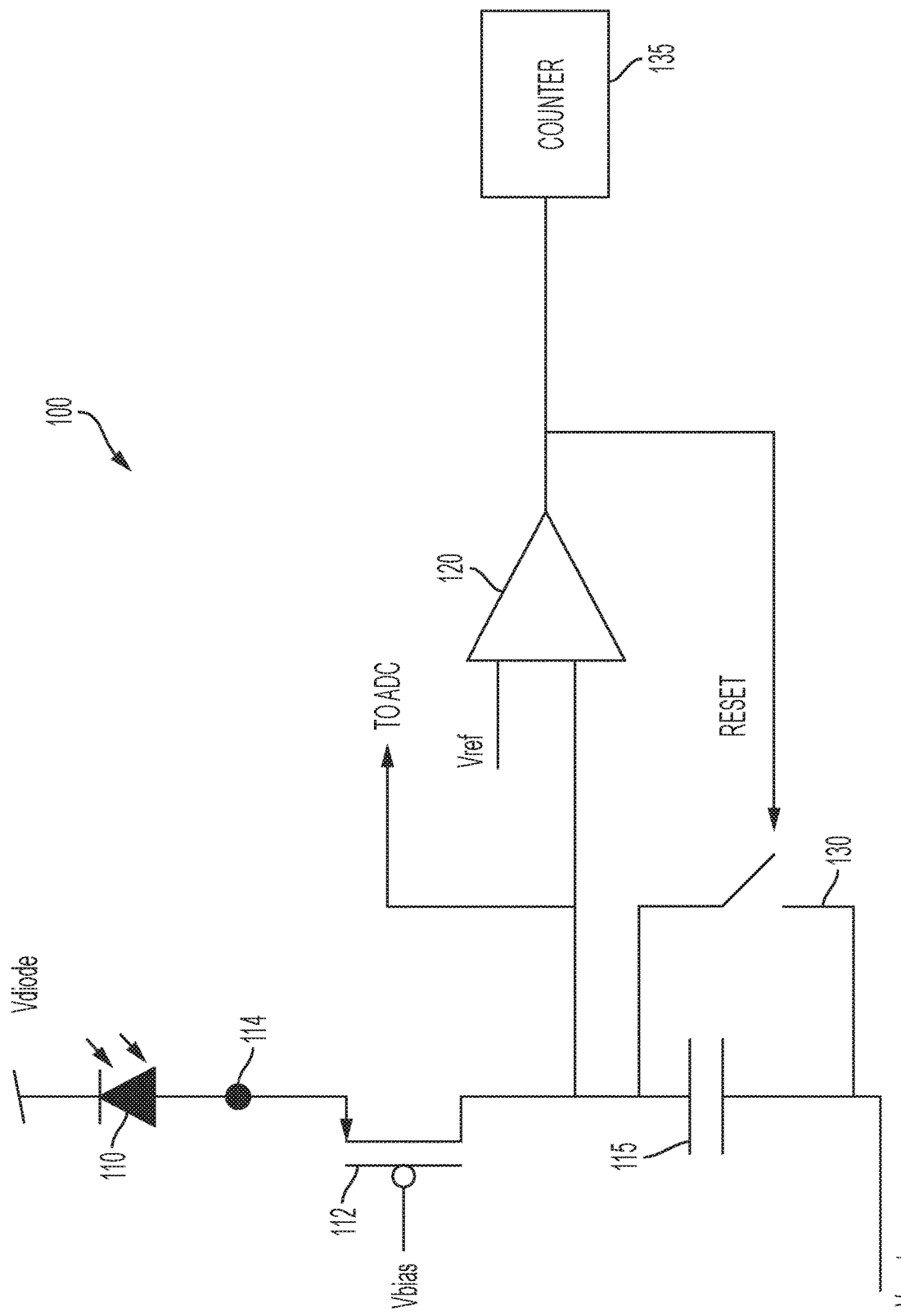
FIG. 1 is a schematic diagram illustrating a prior art in pixel analog-to-digital converter (ADC) circuit.

Disclosed herein is an analog counter that can used, for example, as the counter 135 in FIG. 1. The analog counter transfers a fixed amount of charge to an accumulating capacitor each time the output of the comparator 120 goes high. In particular, analog "counting" is achieved by pulsing a current source to inject charge onto an accumulating capacitor. Any residual charge not transferred is removed into a capacitor so that it will not cause counter non-uniformity.

Herein, the output signal from the comparator shall be referred to as "RESET". In one embodiment, the amount of charge stored on the accumulating transistor is incremented by the fixed amount (analog or "count" voltage step) by enabling a control/enable switch allowing current to flow through an injection transistor for as long as the switch is enabled In some instances, as will be understood from the following discussion, the analog counter disclosed herein can have increased performance/accuracy for the analog voltage step by removing charge from a floating node between the control/enable switch and the biased transistor. In some instances, the analog circuit disclosed herein may provide a simple manner to eliminating leakage onto the accumulating capacitor.

In general, the analog counter disclosed herein utilizes a delayed version the reset pulse (RESET) and its complement RESET* to control current flow into the accumulating transistor. In particular, both a recycle pulse (RP) and its complement (RP*) are created from RESET with RP being delayed relative to RP*. RP* is used to control the control/enable switch. RP is provided to the floating node connected to the biased transistor. The connection is through a capacitor in one embodiment that can be referred to as a feedback capacitor herein. The feedback capacitor can be used to remove excess charge from the floating node so each "count" accumulates the same amount of charge/voltage on the accumulating capacitor. As will be understood based on the teachings herein, by controlling the system with RP being time delayed relative to its complement enables the use of the feedback capacitor to remove excess charge and require less devices. In some embodiment, due the time delay, the falling edge of the recycle pulse (RP) occurs after the RP* rises. This means that the falling edge of RP occurs after the control switch is turned off and the feedback capacitor is large enough to remove all of the floating charge ensuring the current source is turned off.

Figure 2:
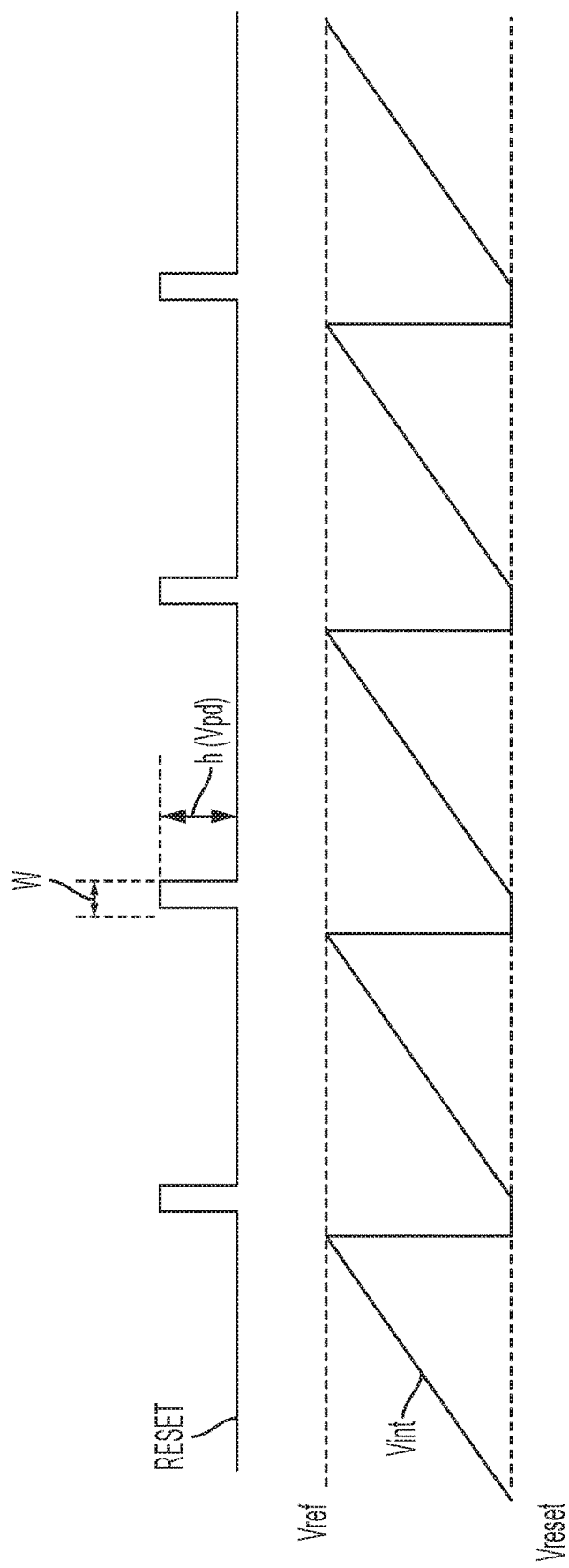
FIG. 2 is a graph illustrating voltage levels corresponding to operation of the ADC circuit of FIG. 1.

FIG. 2 shows waveform diagrams illustrating the various voltage or signal values during operation of the circuit in FIG. 1. As can be seen during, each time Vint meets or exceeds Vref, an output pulse is generated on RESET. The output pulse is generated at the output of the comparator 120. This pulse can be called a comparator reset or recycle pulse herein. That pulse has a height h and width w. Depending on the type of comparator 120 used, h and w can be variable. Herein disclosed is an analog counter that may operate independent of the pulse height h. The height of the pulse can also be referred to as Vpd herein and represents the change in potential provided at the input to the analog counters discussed herein when the comparator 120 generates RESET pulses.

Figure 3:
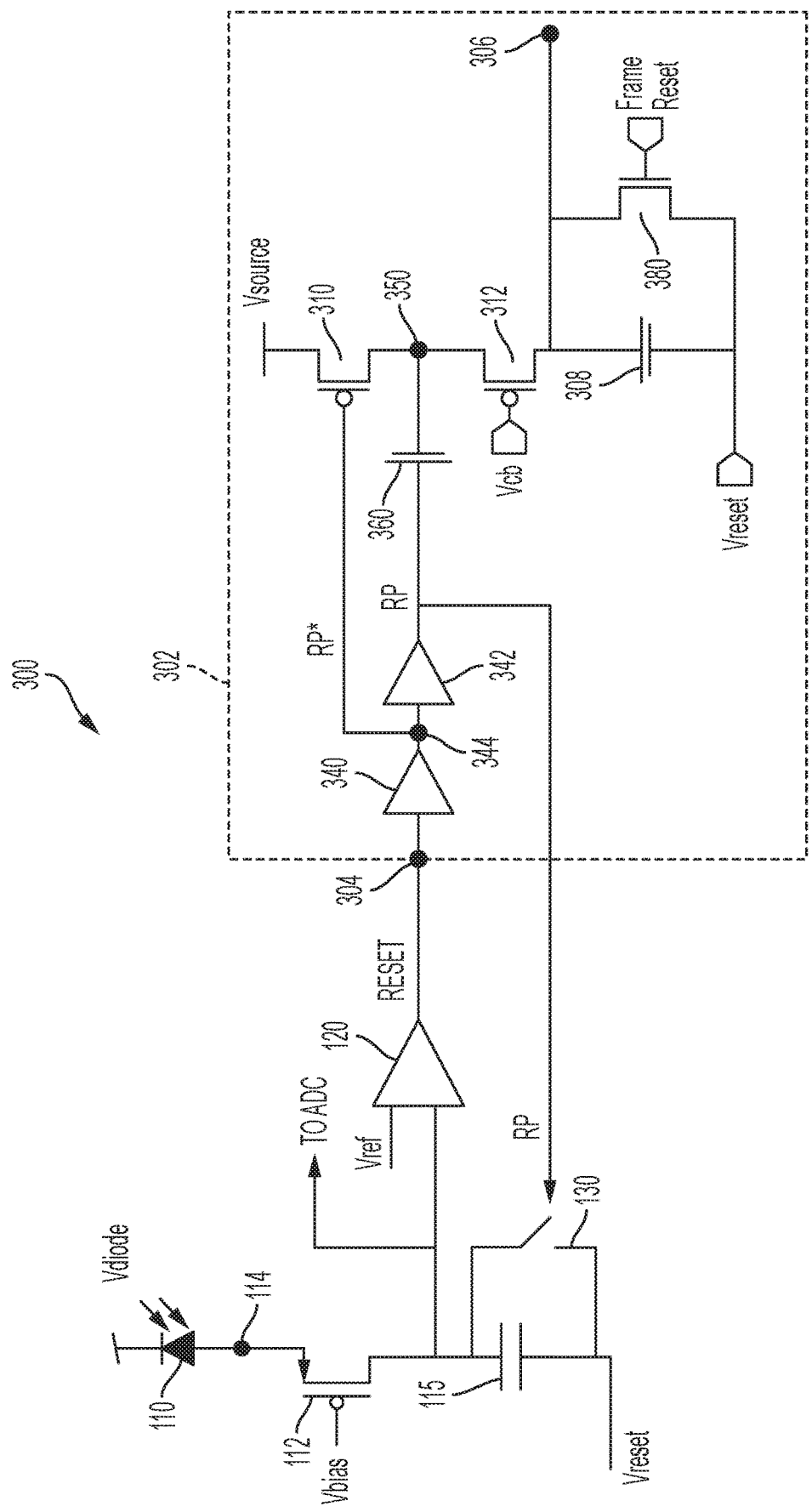
FIG. 3 is a circuit diagram of an analog counter that can used as the counter shown in FIG. 1.

FIG. 3 shows an example of a digital pixel 300 that includes an analog counter 302 according to one embodiment. Operation of the circuit outside of the analog counter 302 is as above and will not be discussed further. It shall be understood that other types of in-pixel devices can be used with the analog counter 302 disclosed herein as long as it generates a RESET pulse. The same is true for all later disclosed embodiments.

The counter 302 includes an input 304 and an output 306. In operation, the input 304 receives RESET pulses from the comparator 120. Each time RESET is received, a fixed amount of charge is caused to be stored in an accumulating capacitor 308. At the end of a frame or other time period, the amount of charge stored on the accumulating capacitor 308 can be read out via the output 306. The amount of charge that is read out is, thus, proportional to the number of RESET pulses received during the frame.

The counter 302 includes a control/enable switch 310 and an injection switch 312 that are connected such that they are between a current source (Vsource) and the accumulating capacitor 308 and control current flow from Vsource to the accumulating capacitor 308. As illustrated in FIG. 3, both the control switch 310 and the injection switch 312 is implemented as a P-type switch but the skilled artisan will realize that other types of switches can be utilized as long at the correct gate input voltages are provided. The switches can be FET, MOSFETs or the like and can be either N-type or P-type.

In the example of FIG. 3, first and second inverters 340, 342 are provided. The first and second inverters 340, 342 are serially connected to one another. The first inverter 340 has an input connected to the input 304 and an output connected to the input of the second inverter 342. A node 344 is shown between the output of the first inverter 340 and the input of the second inverter 342. The signal at node 344 is a slightly time delayed and inverted version of RESET and is denoted at RP* in FIG. 3. The signal at the output of the second inverter 342 is a delayed and inverted version of RP* and is denoted as RP. The skilled artisan will realize that RP will be a slightly time delayed version of RESET but may have a different amplitude therefrom depending on the nature of the comparator 120 and the first and second inverters 340, 342. In contrast to FIG. 1, the control signal provided to reset switch 130 is RP rather than RESET. This ensures that the comparator 120 does not change state prematurely (e.g., before RP falls as will be described below). The amplitude of RP and RP* is typically larger or equal to Vsource.

In the example in FIG. 3, the drain of the control switch 310 is connected to Vsource and the source of the control switch 310 is connected to the injection switch 312. A floating node 350 is defined between the drain of the control switch 310 and the source of the injection switch 312. A feedback capacitor 360 is connected between the output of second inverter 342 and the floating node 350. The gate of the control switch 310 is connected to RP*. When RESET goes high, RP* goes low. In such a case, current can pass from the source to the drain because to voltage between the gate and source (Vgs) is negative. When RP* is low, the transistor 310 will drive the node 350 to Vsource. As long as Vsource is slightly larger than a counter bias voltage Vcb applied to the gate of the injection switch 312, the injection switch 312 will conduct and the charge can be accumulated on the accumulating capacitor 308.

In more detail, the source of injection switch 312 is connected to the floating node 350, the gate of the injection switch 312 is connected to Vcb and the drain is connected to the accumulating capacitor 308. The accumulating capacitor 308 is coupled between the output 306 and Vreset. A frame reset switch 380 is connected in parallel with the accumulating capacitor 308 and works in a manner similar to the reset switch 130 to lower the charge thereon down to the reset level Vreset.

When RESET goes low again, RP* will go high and the control switch 310 will stop passing charge. Shortly thereafter, RP will go low and charge will stop accumulating on the accumulating capacitor 308. Thus, the width of RP*/RP will control the amount of charge accumulated on the accumulating capacitor 308. That is, the width RP*/RP will control the analog voltage step due to RESET going high. This is due to the capacitance on the floating node 350 which is created by the combined total of drain capacitance of the control switch 310, the source capacitance of the injection switch 312 and any other parasitic capacitances incurred during fabrication. After RP goes low, some residual charge may remain at the floating node 350. This residual charge will leak with an exponential decay as a function of time between recycles so that it does not adversely affect the voltage step by non-uniformly influencing the analog counter voltage as described earlier. As connected in FIG. 3, the counter 302 can discharge this voltage into the switch 380.

It shall be understood that the above described analog counters can be implemented as the counter 135 in FIG. 1. As such, in one embodiment, the teachings herein can be utilized to form a digital pixel. Such a pixel can include a photocurrent source 110, an injection transistor 112 connected to the photocurrent source and an integration capacitor 115 that is connected to a reset (Vreset) voltage. The comparator 120 has inputs operatively connected to the injection transistor 112 and to a reference voltage (Vref). The comparator 120 has an output on which, as discussed above, an output RESET signal is provided that has either a high or low value based on a relationship between the reference voltage and a voltage on the integration capacitor 115. In one instance, RESET is high when reference voltage is exceeded by the voltage on the integration capacitor 115. The output of the comparator 120 is connected the input of any of the analog counters discussed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An analog counter circuit for use with a digital pixel, the analog counter circuit comprising:
   an input;
   an output;
   a first inverter connected to the input that produces on a first inverter output a time delayed inverted signal (RP*) from an input signal received at the input;
   a second inverter connected to the first inverter output that produces a time delayed signal (RP) at a second inverter output from the input signal and that is delayed relative to RP*;
   a control switch connected between a source voltage and a floating node, wherein the control switch is controlled by the signal RP* on the first inverter output;
   a feedback capacitor connected between the second inverter output and the floating node;
   an accumulating capacitor that accumulates at least some of a charge that passes through the control switch; and
   an injection switch connected between the control switch and the accumulating capacitor.

2. The analog counter circuit of claim 1, wherein the accumulating capacitor is connected between the output and a reset voltage.

3. The analog counter circuit of claim 2, further comprising a frame reset switch connected in parallel with the accumulating capacitor.

4. The analog counter circuit of claim 1, wherein the injection switch has gate that is connected to a counter bias voltage Vcb.

5. The analog counter circuit of claim 1, wherein the control switch is a P-channel MOSFET that has a gate, a drain and a source.

6. The analog counter of claim 5, wherein the gate of the P-channel MOSFET is connected to the first inverter output.

7. The analog counter of claim 6, wherein the drain of the P-channel MOSFET is connected to source voltage and the source of the P-channel MOSFET is connected to the floating node.

8. The analog counter of claim 7, wherein the injection switch is a P-channel MOSFET with an injection gate connected to bias voltage, an injection drain connected to the floating node and an injection source connected to the output and the accumulating capacitor.

9. A digital pixel including
   a photocurrent source;
   an injection transistor connected to the photocurrent source;

an integration capacitor connected between the injection transistor and a reset voltage;
a comparator having inputs connected to the injection transistor and to a reference voltage, the comparator having an output on which it provides an output RESET signal that has either a high or low value based on a relationship between the reference voltage and a voltage on the integration capacitor; and
an analog counter connected to the output of the comparator, the analog counter comprising:
an input;
an output;
a first inverter connected to the input that produces on a first inverter output a time delayed inverted signal (RP*) from an input signal received at the input;
a second inverter connected to the first inverter output that produces a time delayed signal (RP) at a second inverter output from the input signal and that is delayed relative to RP*;
a control switch connected between a source voltage and a floating node, wherein the control switch is controlled by the signal RP* on the first inverter output;
a feedback capacitor connected between the second inverter output and the floating node;
an accumulating capacitor that accumulates at least some of a charge that passes through the control switch; and
an injection switch connected between the control switch and the accumulating capacitor.

10. The digital pixel of claim 9, wherein the accumulating capacitor is connected between the output and a reset voltage.

11. The digital pixel of claim 10, further comprising a frame reset switch connected in parallel with the accumulating capacitor.

12. The digital pixel of claim 9, wherein the injection switch has gate that is connected to a counter bias voltage Vcb.

13. The digital pixel of claim 12, wherein the control switch is a P-channel MOSFET that has a gate, a drain and a source.

14. The digital pixel of claim 13, wherein the gate of the P-channel MOSFET is connected to the first inverter output.

15. The digital pixel of claim 14, wherein the drain of the P-channel MOSFET is connected to source voltage and the source of the P-channel MOSFET is connected to the floating node.

16. The digital pixel of claim 15, wherein the injection switch is a P-channel MOSFET with an injection gate connected to bias voltage, an injection source connected to the floating node and an injection drain connected to the output and the accumulating capacitor.

17. The digital pixel of claim 8, further comprising:
a reset switch connected in parallel with the integrating capacitor, the reset switch being controlled by the time delayed signal (RP).

18. The digital pixel of claim 17, wherein a gate of the reset switch is connected to the second inverter output.

* * * * *